(12) United States Patent
Jang et al.

(10) Patent No.: US 7,049,197 B2
(45) Date of Patent: May 23, 2006

(54) METHOD OF MANUFACTURING A SEMICONDUCTOR DEVICE

(75) Inventors: Woo-Soon Jang, Seoul (KR); Joon Kim, Seoul (KR); Eun-Kuk Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/976,680

(22) Filed: Oct. 28, 2004

(65) Prior Publication Data

US 2005/0164455 A1   Jul. 28, 2005

(30) Foreign Application Priority Data

Oct. 31, 2003   (KR) ...................... 10-2003-0076570

(51) Int. Cl.
*H01L 21/336* (2006.01)
(52) U.S. Cl. ...................... 438/270; 438/197; 438/381; 438/733
(58) Field of Classification Search ................ 438/270, 438/197, 238, 257, 381, 391, 723, 724, 733, 438/734, 735, 744, 745, 756, 757, 954
See application file for complete search history.

(56) References Cited

U.S. PATENT DOCUMENTS

| 6,797,559 B1 * | 9/2004 | Lee et al. .................... 438/239 |
| 2004/0063286 A1 * | 4/2004 | Kim et al. .................... 438/283 |
| 2004/0113212 A1 * | 6/2004 | Lee et al. .................... 257/408 |

FOREIGN PATENT DOCUMENTS

KR   2002-0033846   5/2002

* cited by examiner

*Primary Examiner*—David Nhu
(74) *Attorney, Agent, or Firm*—Marger Johnson & McCollom, P.C.

(57) ABSTRACT

In a method of manufacturing a semiconductor device including independent gate patterns separated from each other, an active region is defined by forming a field region on a substrate. A gate oxide layer and a polysilicon layer are formed on the substrate. A preliminary gate pattern is formed by partially removing the polysilicon layer along a first direction by a first etching process. A spacer is formed along a side surface of the preliminary gate pattern. A number of separated gate patterns is formed by partially removing the preliminary gate pattern along a second direction crossing the first direction by a second etching process. The gate patterns overlap with the active regions and are separated from each other. Therefore, the overlap margin is increased, and the polysilicon layer is prevented from being over-etched when it is patterned to form the gate pattern.

19 Claims, 9 Drawing Sheets

METHOD OF MANUFACTURING A SEMICONDUCTOR DEVICE

CROSS-REFERENCE TO RELATED APPLICATIONS

This application claims priority from Korean Patent Application No. 2003-76570 filed on Oct. 31, 2003, the content of which is herein incorporated by reference in its entirety for all purposes.

BACKGROUND OF THE INVENTION

1. Field of the Invention

This disclosure relates to a method of manufacturing a semiconductor device, and more particularly, to a method of manufacturing a semiconductor device having separated and independent gate patterns with minute thicknesses.

2. Description of the Related Art

Generally, a semiconductor memory device is classified into dynamic random access memory (DRAM) and static random access memory (SRAM) in accordance with data storing method. An SRAM device has many advantages such as a high operating speed, low power consumption, and simplified operation, thus it has been the focus of intense interest in recent years. In addition, the SRAM device is also advantageous because no refresh is needed for storing data as compared with a DRAM.

In general, a SRAM device may include a pair of pull-down transistors (hereinafter, referred to as driving transistors), a pair of pass transistors, and a pair of pull-up transistors. The SRAM device may also be classified as a full complementary metal oxide semiconductor (CMOS) type, a high load resistor (HLR) type, and a thin film transistor (TFT) type in accordance with a structure of the pull-up transistor.

The full CMOS type SRAM uses a P-channel bulk MOSFET as a pull-up device, and the HLR type SRAM uses a high resistive polysilicon layer as a pull-up device. Further, the TFT type SRAM uses a P-channel polysilicon TFT as a pull-up device. The full CMOS type SRAM has the advantages of a low standby current and a steady operation as compared with the other types of SRAM.

FIG. 1 is a circuit diagram of a conventional full CMOS type SRAM.

As shown in FIG. 1, a cell of a conventional SRAM includes first and second pass transistors Q1 and Q2, a first P-MOS transistor Q5, and a first N-MOS transistor Q3. The first pass transistor Q1 electrically connects a first bit line BL1 with a first memory cell node Nd1, and the second pass transistor Q2 electrically connects a second bit line BL2 with a second memory cell node Nd2. The first P-MOS transistor Q5 is electrically interconnected between a power source voltage Vcc and the first memory cell node Nd1, and the first N-MOS transistor Q3 is electrically interconnected between a base voltage Vss and the first memory cell node Nd1. The first P-MOS transistor Q5 and the first N-MOS transistor Q3 are selectively operated in accordance with a signal of the second memory cell node Nd2, thus the power source voltage Vcc or the base voltage Vss is selectively applied to the first memory cell node Nd1.

The cell of a conventional SRAM further includes a second P-MOS transistor Q6 and a second N-MOS transistor Q4. The second P-MOS transistor Q6 is electrically interconnected between the power source voltage Vcc and the second memory cell node Nd2, and the second N-MOS transistor Q4 is electrically interconnected between a base voltage Vss and the second memory cell node Nd2. The second P-MOS transistor Q6 and the second N-MOS transistor Q4 are selectively operated in accordance with a signal of the first memory cell node Nd1, thus the power source voltage Vcc or the base voltage Vss is selectively applied to the second memory cell node Nd2.

One of the first pass transistors Q1, one of the driving transistors Q3, and one of the pull-up transistors Q5 are electrically interconnected with one another at the first memory cell node Nd1. Another pass transistor Q2, another driving transistor Q4, and another pull-up transistor Q6 are electrically interconnected with one another at the second memory cell node Nd2.

As described above, the conventional full CMOS type SRAM includes a number of N-MOS transistors Q1, Q2, Q3, and Q4 as well as a number of P-MOS transistors Q5 and Q6. As a result, the transistors of the SRAM cannot be formed into a lined gate structure such as the gate structure of the cell of a DRAM or a non-volatile memory (NVM). Thus, each of the transistors in the cell of the conventional full CMOS type SRAM is formed as an independent pattern separated from each other, which is called an island pattern as compared with the DRAM or the NVM.

A gate electrode of the transistor in the SRAM is formed at a portion of an active region of a wafer with which the gate pattern is overlapped, thus the gate pattern needs to be sufficiently long enough to overlap with the active region in order that an effective length of the gate is not reduced in operation of the SRAM. However, when the gate pattern is formed by a conventional photolithography process, a peripheral portion of the gate pattern is formed to be a round shape.

FIG. 2 is a plan view illustrating a number of conventional separated gate patterns.

Referring to FIG. 2, a number of rectangular active regions 10 is defined on the wafer, and gate patterns 12 overlap the active regions 10. However, the overlapping area of the active region 10 is reduced at the peripheral portion A of the gate pattern 12. Thus, a channel region for passing electrons is narrowed at the peripheral portion A of the gate pattern 12, thereby generating an operating failure of the transistor.

To minimize the operating failure of the transistor, the gate patterns 12 are sufficiently long to overlap with the active regions 10. That is, the gate pattern 12 is lengthened to extend the active region 10 such that the rounded peripheral portion A of the gate pattern 12 is not positioned over the active region 10. However, the trend towards increasing degrees of integration in a SRAM device has gradually reduced a processing margin M for the overlap of the gate pattern 12 with the active region 10, thus the gate patterns of conventional SRAM devices manufactured according to minute design rules are typically formed by a trim mask process.

FIGS. 3A to 3D are perspective views illustrating the processing steps of a conventional method for manufacturing a gate of the SRAM device using a conventional trim mask. In FIGS. 3A to 3D, a three dimensional Cartesian coordinate system is introduced with an x-direction as a longitudinal direction of the substrate, a y-direction as a latitudinal direction of the substrate and a z-direction as a height direction of the substrate.

Referring to FIG. 3A, an active region is defined by a field region 52 on a surface portion of the substrate 50. A gate oxide layer 54, a polysilicon layer 56, and a hard mask layer 58 are sequentially coated on the substrate 50.

Referring to FIG. 3B, the hard mask layer 58 is partially etched away in an area corresponding to the field region 52, leaving an opening portion 581a having a predetermined depth along the y direction and a predetermined width along the x direction. As a result, a trim mask 58a is formed on the polysilicon layer 56 for separating the polysilicon layer 56 according to the active region, and the polysilicon layer 56 is partially exposed through an opening portion 581a of the trim mask 58a.

Referring to FIG. 3C, a photoresist pattern 60 for patterning the polysilicon layer 56 is formed on surfaces of the trim mask 58a and the exposed polysilicon layer 56. A photoresist layer is coated on surfaces of the trim mask 58a and the exposed polysilicon layer 56, and is exposed by light having a predetermined wavelength along the x direction, perpendicular to the opening portion 581a of the trim mask 58a. Then, a developer is supplied on the exposed photoresist layer to thereby form the photoresist pattern 60 that exposes the opening portion 581a of the trim mask 58a along the x direction of the substrate 50.

When the exposed photoresist layer is developed on the trim mask 58a, the developer dissolves the photoresist layer, and comes into direct contact with the polysilicon layer 56 since the polysilicon layer 56 is exposed through the opening portion 581a of the trim mask 58a. As a result, an etching characteristic of the polysilicon layer 56 is changed by the developer. Specifically, the developer isotropically diffuses and permeates into the polysilicon layer 56, thus an etching characteristic of a neighboring polysilicon layer adjacent to the exposed polysilicon layer 56 is changed along with the exposed polysilicon layer 56. For example, the etching rate of the exposed polysilicon layer is increased due to the developer.

Referring to FIG. 3D, the trim mask 58a is partially etched away using the photoresist pattern as an etching mask 60 along the x direction, so that the trim mask 58a is separated by a channel running in the x direction to form a number of hard mask patterns 62 that are separated along the y direction. Next, the polysilicon layer 56 is partially etched away using the hard mask patterns 62 as etching masks to thereby form the gate patterns 56a. The gate patterns 56a are independently formed according to the active region and separated along the y direction of the substrate 50.

The polysilicon layer 56 exposed by the opening portion 58 1a of the trim mask 58a has a higher etching rate than the other portion thereof, thus the polysilicon layer 56 adjacent to the opening portion 581a is usually over-etched by the developer. Accordingly, even the polysilicon layer corresponding to the active region is etched away during the etching process of the exposed polysilicon layer 56, the gate pattern 56a may be broken and an operation failure may be generated.

Embodiments of the invention address these and other disadvantages of the conventional art.

SUMMARY OF THE INVENTION

Embodiments of the invention provide a method of manufacturing a semiconductor device that prevents the gate pattern from being broken while obtaining a sufficient processing margin for overlap with an active region.

According to embodiments of the invention, the polysilicon layer is not exposed in patterning the photoresist layer, so that process failures generated at the active region during the etching process on the polysilicon layer may be prevented.

BRIEF DESCRIPTION OF THE DRAWINGS

The above and other features and advantages of embodiments of the invention will become readily apparent by considering the following detailed description in conjunction with the accompanying drawings.

DETAILED DESCRIPTION OF THE INVENTION

The teachings of the invention are described more fully below with reference to the accompanying drawings where exemplary embodiments of the invention are shown.

Figure 4:
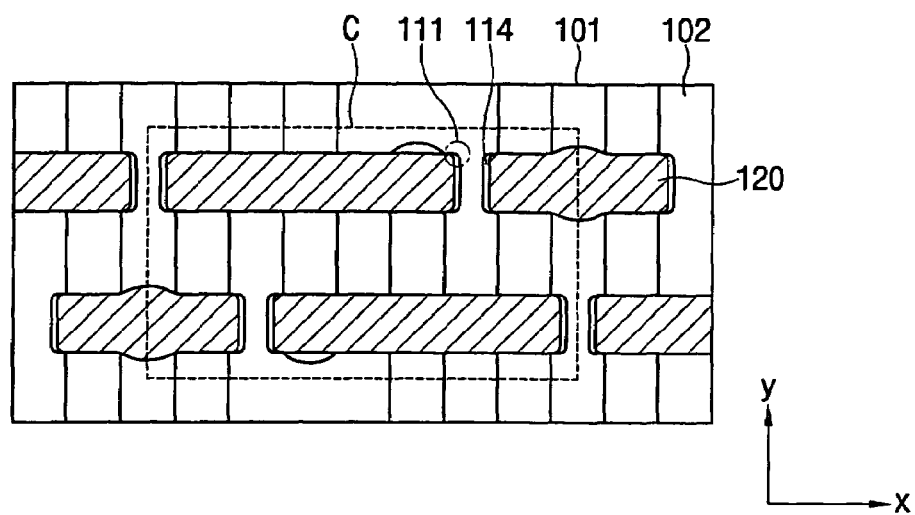
FIG. 4 is a plan view schematically illustrating an active region and a separated gate pattern in a cell of a full CMOS type SRAM according to some embodiments of the invention.

FIG. 4 is a plan view schematically illustrating an active region and a separated gate pattern in a cell of a full CMOS type SRAM according to some embodiments of the invention.

Figure 1:
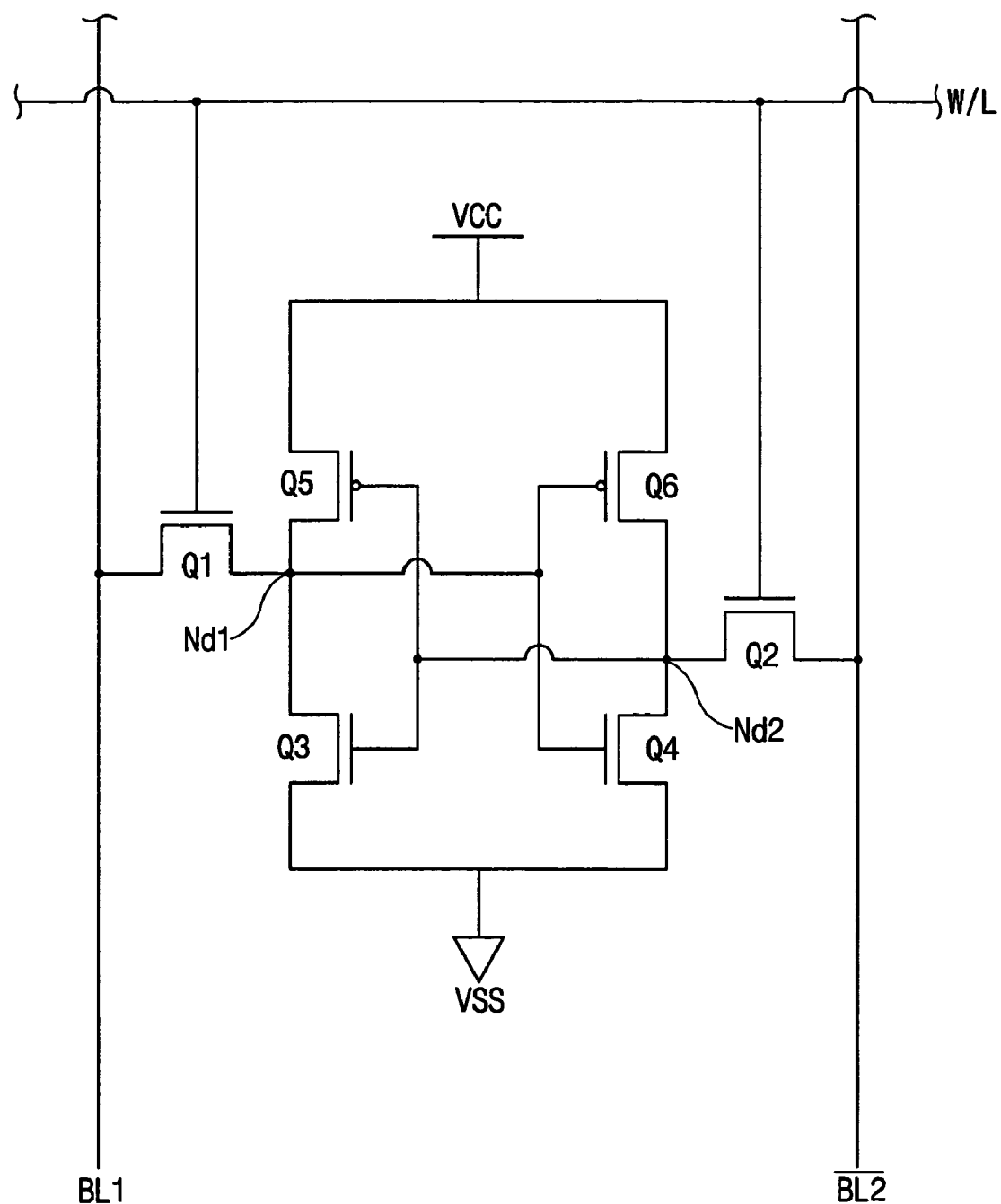
FIG. 1 is a circuit diagram illustrating a conventional full CMOS type SRAM.
Figure 2:
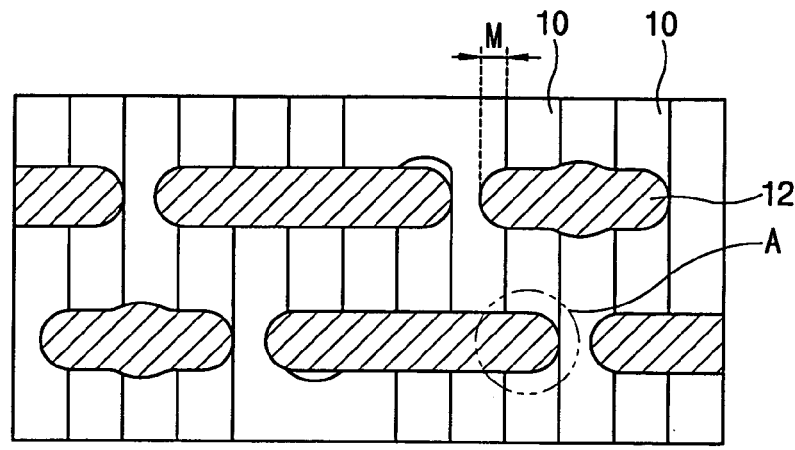
FIG. 2 is a plan view diagram illustrating a number of conventional separated gate patterns.
Figure 3A:
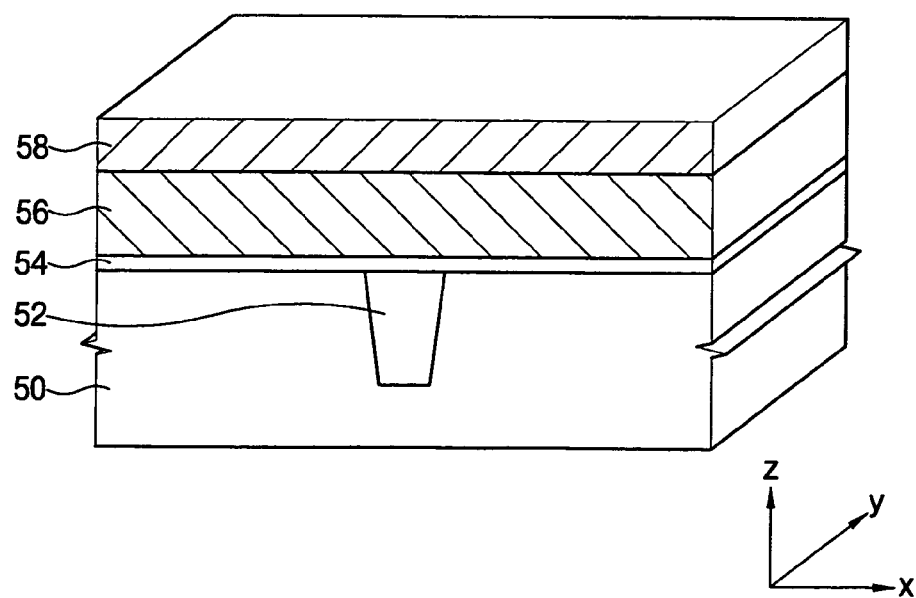
FIGS. 3A to 3D are perspective views illustrating the processing steps for a conventional method of manufacturing a gate of the SRAM using a conventional trim mask.
Figure 3B:
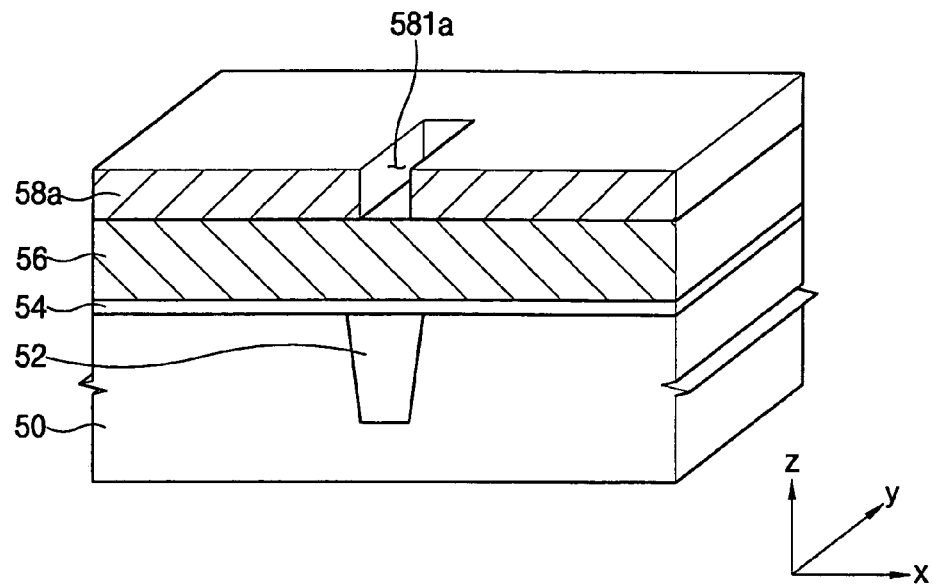
Figure 3C:
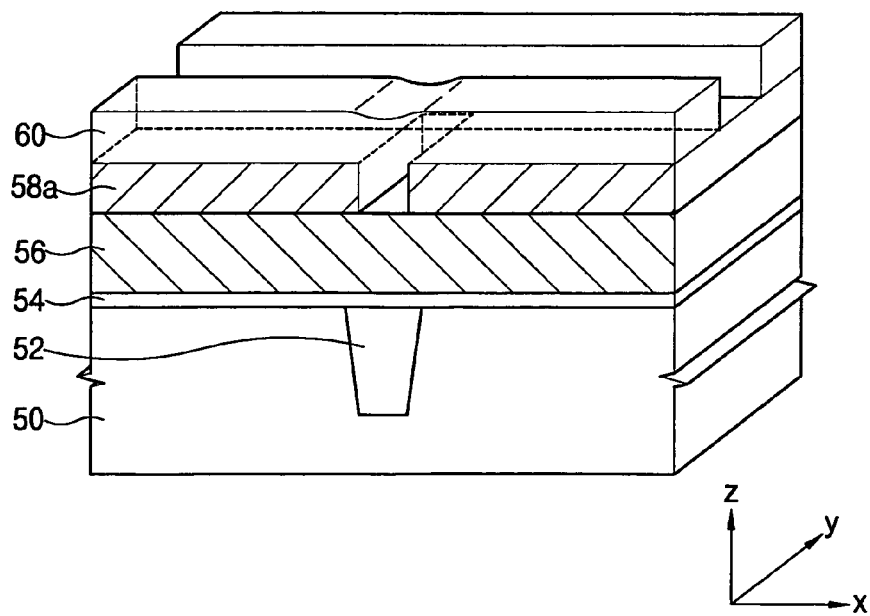
Figure 3D:
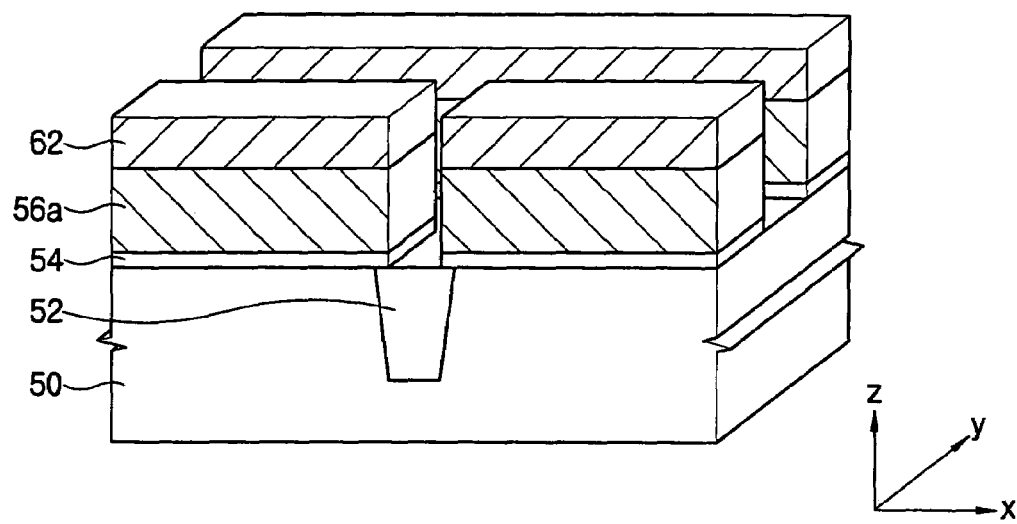

The cell structure of the full CMOS type SRAM according to some embodiments of the invention include the same components as that of the conventional full CMOS type SRAM as illustrated in FIG. 1.

That is, a cell of the full CMOS type SRAM according to some embodiments of the invention includes first and second pass transistors Q1 and Q2, a first P-MOS transistor Q5, and a first N-MOS transistor Q3. The first pass transistor Q1 electrically connects a first bit line BL1 with a first memory cell node Nd1, and the second pass transistor Q2 electrically connects a second bit line BL2 with a second memory cell node Nd2. The first P-MOS transistor Q5 is electrically interconnected between a power source voltage Vcc and the first memory cell node Nd1, and the first N-MOS transistor Q3 is electrically interconnected between a base voltage Vss and the first memory cell node Nd1. In addition, the cell of the SRAM includes a second P-MOS transistor Q6 and a second N-MOS transistor Q4. The second P-MOS transistor Q6 is electrically interconnected between the power source voltage Vcc and the second memory cell node Nd2, and the second N-MOS transistor Q4 is electrically interconnected between a base voltage Vss and the second memory cell node Nd2.

As described above, the full CMOS type SRAM cell includes a number of N-MOS transistors Q1, Q2, Q3, and Q4 as well as a number of P-MOS transistors Q5 and Q6, thus active regions are prepared on the substrate that correspond to the N-MOS and P-MOS transistors, respectively. Accordingly, the gate patterns corresponding to each active region are separated from each other.

Referring to FIG. 4, a number of chips are formed on the substrate, and a cell array including a number of SRAM unit cells is positioned in the chip. There are many SRAM unit cells positioned in the cell array, and each region in the cell array where a unit cell is positioned is referred to as unit cell region C. In FIG. 4, a two dimensional Cartesian coordinate system that includes an x-axis and a y-axis is introduced for convenience's sake. The x-axis is in parallel with a longitudinal direction of the substrate, and a y-axis is in parallel with a latitudinal direction of the substrate.

The unit cell region C includes a P-well region defined by a well region of the N-MOS transistor, and an N-well region defined by a well region of the P-MOS transistor. The P-well region is doped with P type dopants, also known as acceptors, and the N-well region is doped with N type dopants, also known as donors.

A number of linear active regions are arranged in the P-well and N-well regions along the y-axis, and a number of gate patterns 120 are arranged to cross over the active region 101 along the x-axis. The gate pattern 120 includes a gate oxide layer, a polysilicon layer, and a trim mask layer that are sequentially stacked in that order on the substrate. The gate pattern 120 functions as a gate electrode in the P-MOS transistor or the N-MOS transistor. Every corner portion 111 of each gate pattern 120 is shaped substantially as a right angle.

A spacer 114 that includes silicon oxides is formed along a side surface of the gate pattern 120 to a thickness in a range from about 10 Å to about 150 Å. As illustrated in FIG. 4, the spacer 114 is formed along side surfaces of the gate pattern 120 that are parallel to the y-axis. In alternative embodiments, the spacers 114 may be formed along side surfaces of the gate pattern 120 that are parallel with the x-axis.

Since the corner portions 111 of the gate patterns 120 are formed at approximately right angles, the process margin that allows the gate pattern to overlap the active region 101 is increased compared to the conventional case when the gate pattern has a semicircular-shaped end portion. In addition, the spacer 114 prevents the active region 101 from being recessed.

FIGS. 5A to 5F are perspective views illustrating a method of manufacturing the SRAM device of FIG. 4 according to some embodiments of the invention. FIGS. 6A to 6C are plan views illustrating a method of manufacturing the SRAM device of FIG. 4 according to some embodiments of the invention. In FIGS. 5A to 5F, a three dimensional Cartesian coordinate system including an x-axis, a y-axis and a z-axis is introduced for convenience's sake. The x-axis is parallel with a longitudinal direction of the substrate, and the y-axis is parallel with a latitudinal direction of the substrate. The z-axis is parallel with a height direction of the substrate. In addition, FIGS. 6A to 6C are plan views illustrating the SRAM device with reference to the x-y plane of the Cartesian coordinate system.

Figure 5A:
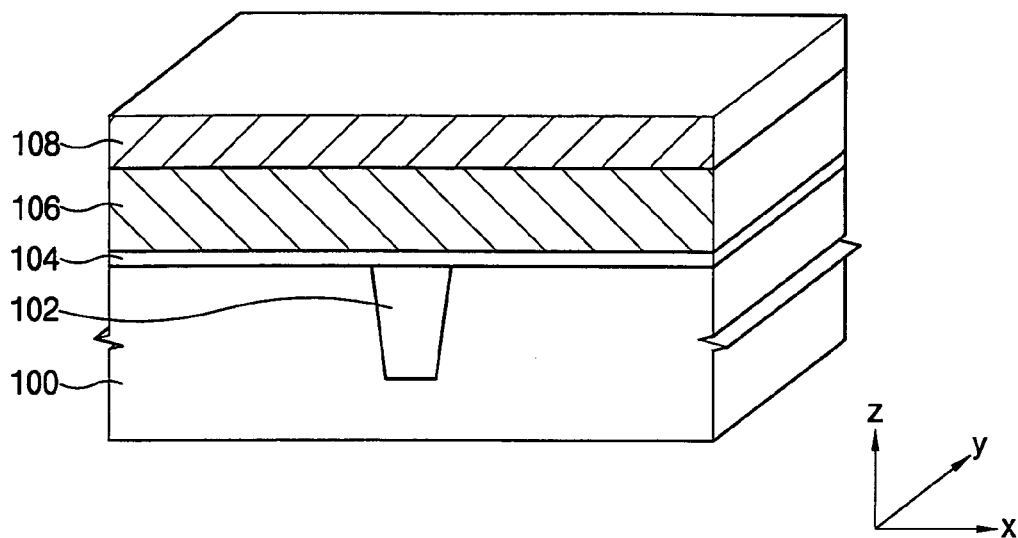
FIGS. 5A to 5F are perspective views illustrating a method of manufacturing the SRAM device of FIG. 4 according to some embodiments of the invention.
Figure 6A:
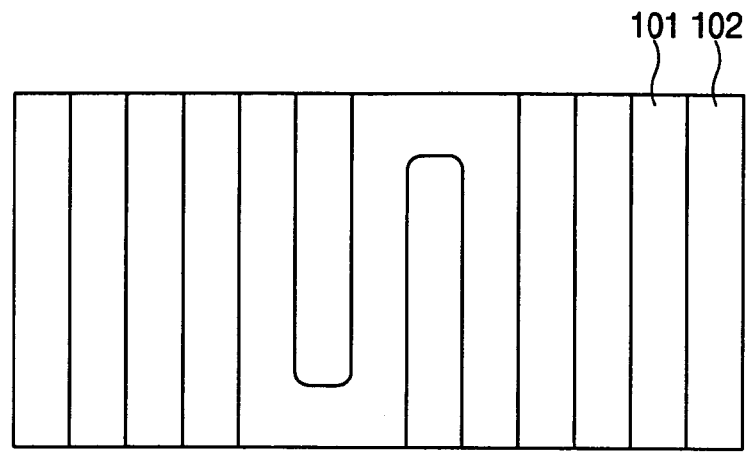
FIGS. 6A to 6C are plan views illustrating a method of manufacturing the SRAM device of FIG. 4 according to some embodiments of the invention.
Figure 6B:
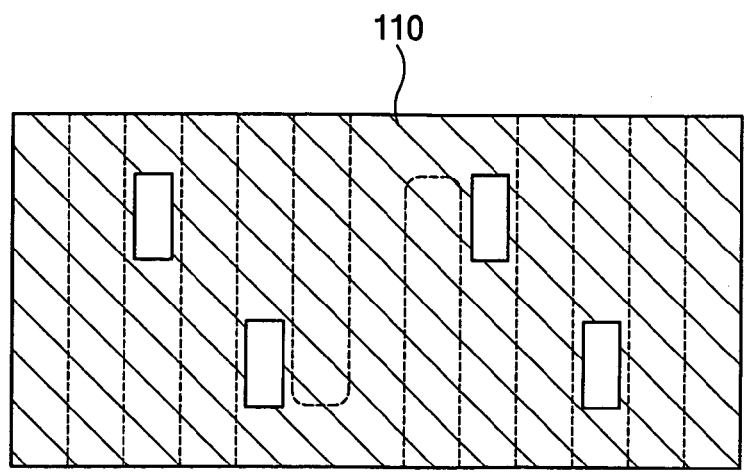
Figure 6C:
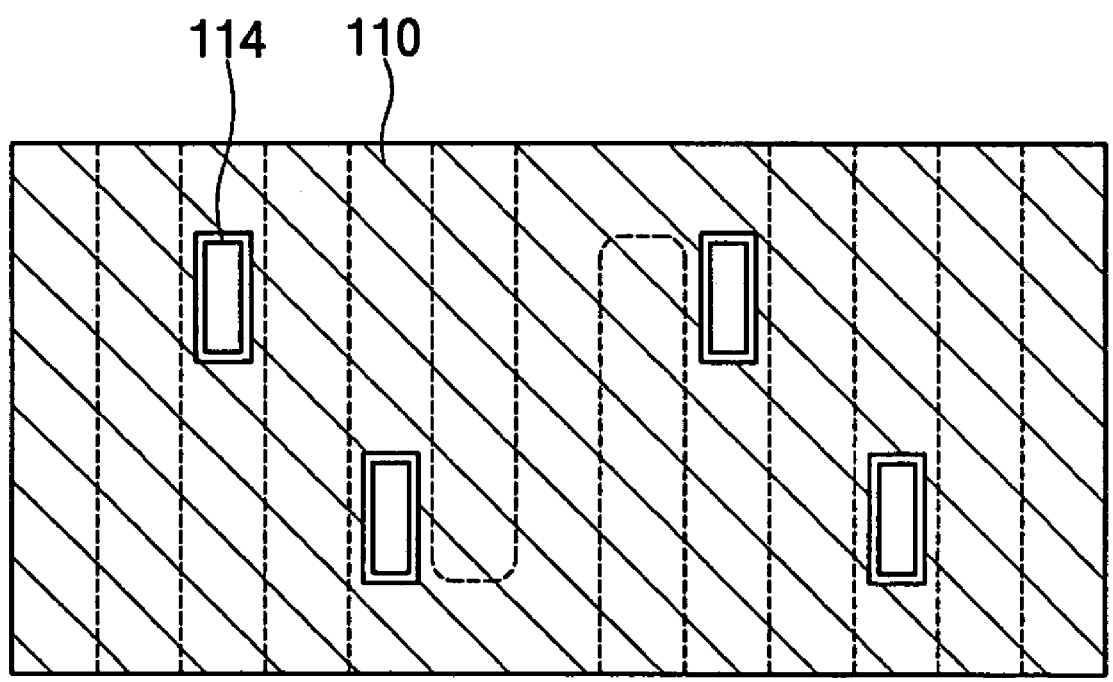

Referring to FIG. 5A, an active region is defined by forming a field region 102 on a semiconductor substrate 100. For example, the field region 102 may be formed by a conventional shallow trench isolation (STI) process. Then, dopants are implanted on the active region, so that well regions (not shown) corresponding to each transistor are formed in the active region.

In general, recent SRAM devices having a design rule no more than about 100 nm have a linear type active region as shown in FIG. 6A. Thus, hereinafter the invention will be described based upon an exemplary SRAM device having a linear type active region. However, any other active region having a non-linear shape may be utilized in conjunction with or in place of the linear shape, as would be known to one of the ordinary skill in the art.

A gate oxide layer 104 and a polysilicon layer 106 are sequentially formed on the substrate 100 on which the active region and the field region 102 are formed. A trim mask 108 is formed on the polysilicon layer 106. In an exemplary embodiment, the trim mask 108 includes a silicon nitride layer or a silicon oxy-nitride layer.

Figure 5B:
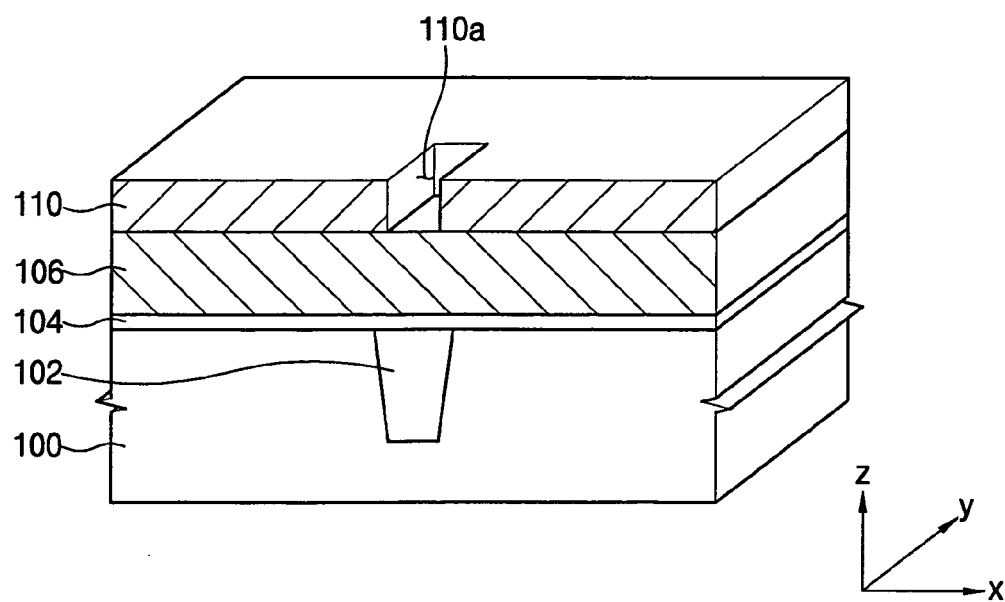

Referring to FIG. 5B, a photoresist layer is coated on the trim mask 108, and the photoresist layer is exposed and developed to thereby form a photoresist pattern on the trim mask layer 108. Then, the trim mask layer 108 is partially etched away to a predetermined distance in the y-axis direction using the photoresist layer as an etching mask, and as a result, a trim mask 110 is formed to have a first recessed portion 110a that is recessed to a predetermined distance from an edge line thereof along the y-axis direction so as to separate the polysilicon layer 106 along the x-axis direction. The polysilicon layer 106 under the trim mask 110 is exposed through the first recessed portion 110a.

The trim mask 110 may be used for patterning the polysilicon layer 106 along a longitudinal direction or a latitudinal direction of a separated gate pattern that is formed in a subsequent processes. As an exemplary embodiment, the polysilicon layer 106 is patterned along a first direction that is parallel with the longitudinal direction of the active region 101. Here, the first direction is the x-axis direction with reference to the Cartesian coordinate system.

The first recessed portion 110a of the trim mask 110 corresponds to the field region 102, so that a top surface of the field region 102 is exposed when the polysilicon layer 106 and the gate oxide layer 104 are removed.

Figure 5C:
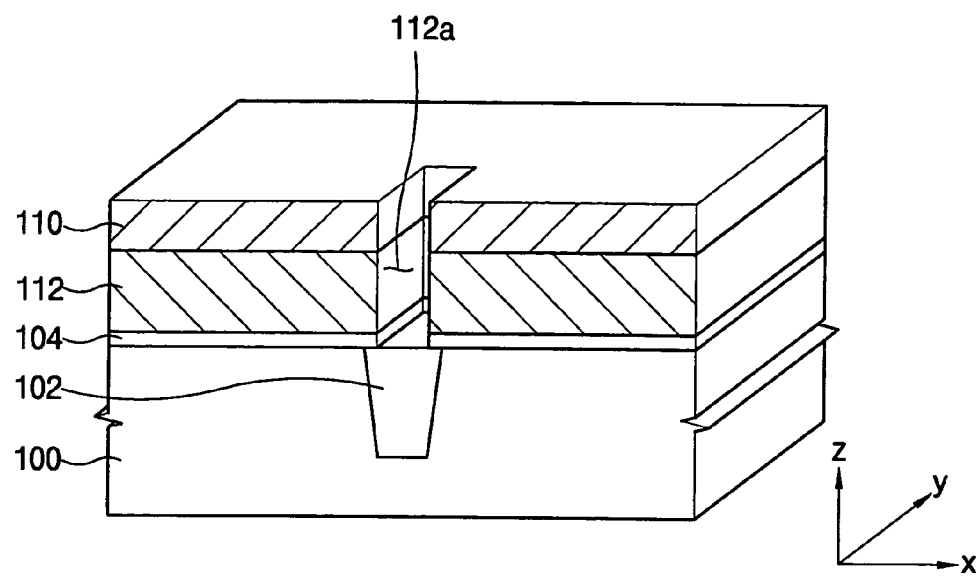

Referring to FIG. 5C, the polysilicon layer 106 and the gate oxide layer 104 under the polysilicon layer 106 are partially etched away using the trim mask 110 as an etching mask, thus the polysilicon layer 106 and the gate oxide layer 104 are also recessed in accordance with the recessed portion 110a of the trim mask 110 to thereby form a second recessed portion 112a in the y-axis direction from an edge line of the polysilicon layer 106 and the gate oxide layer 104. Hereinafter, the polysilicon layer 106 having the second recessed portion 112a is referred to as a preliminary gate pattern 112. That is, the preliminary gate pattern 112 is formed on the substrate 100 by an etching process, thus the top surface of the field region 102 is exposed through the second recessed portion 112a of the preliminary gate pattern 112. The etching process for forming the second recessed portion 112a of the preliminary gate pattern 112 is carried out with a higher etching rate of the polysilicon layer than the silicon oxide layer forming the field region 102 (that is, the etching selectivity of the preliminary gate pattern 112 with respect to the silicon oxide layer is maintained during the etching process), thus the field region 102 is prevented from being etched when forming the second recessed portion 112a. Furthermore, a top surface of the trim mask 110 is also etched away when forming the second recessed portion 112a, since the etching process uses the trim mask 110 as an etching mask. Therefore, the trim mask layer 108 is formed to have a sufficient thickness considering the thickness to be etched away during the etching process that uses the trim mask 110 as an etching mask. As shown in FIG. 6B, the preliminary gate pattern 112 under the trim mask 110 is formed along a direction, either the longitudinal direction or the latitudinal direction of the separated gate pattern to be formed in the subsequent process.

Figure 5D:
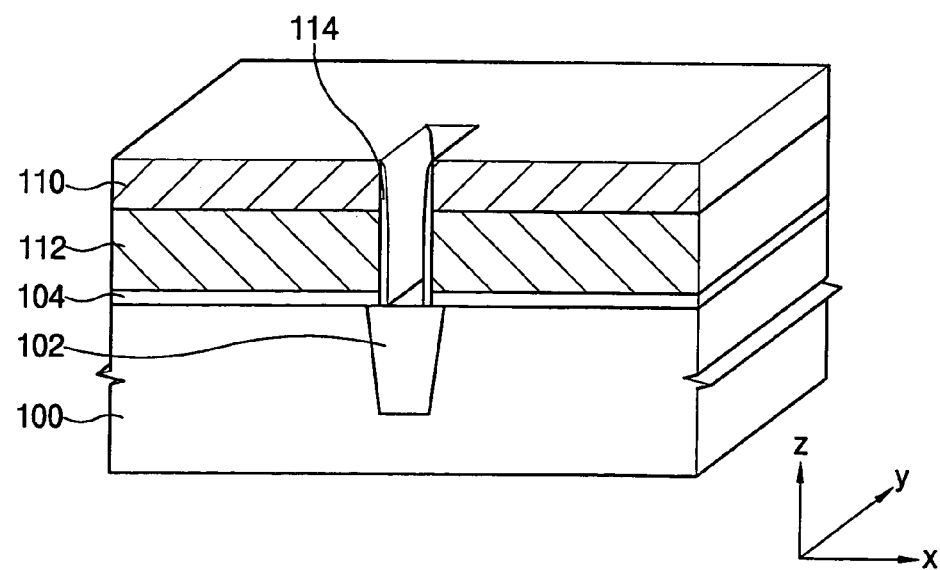

Referring to FIG. 5D, an insulation layer is formed on the preliminary gate pattern 112 and the substrate 100 to a thickness in a range from about 10 Å to about 150 Å. As an exemplary embodiment, the insulation layer may include a silicon oxide layer coated at a temperature of about 200° C. When the insulation layer is formed at a temperature over about 200° C., the dopants in the well regions are diffused, and the doping profile in the well regions may be poor.

The insulation layer is then anisotropically etched to form a spacer 114 for protecting the side surface of the preliminary gate pattern at the second recessed portion 112a. In FIG. 6C, the spacer 114 prevents the preliminary gate pattern 112 from being exposed. The anisotropic etching process for forming the spacer 114 is carried out with an optimized etching selectivity of the insulation layer with respect to the silicon oxide layer forming the field region 102, thus the field region 102 is prevented from being etched when the spacer 114 is formed.

Figure 5E:
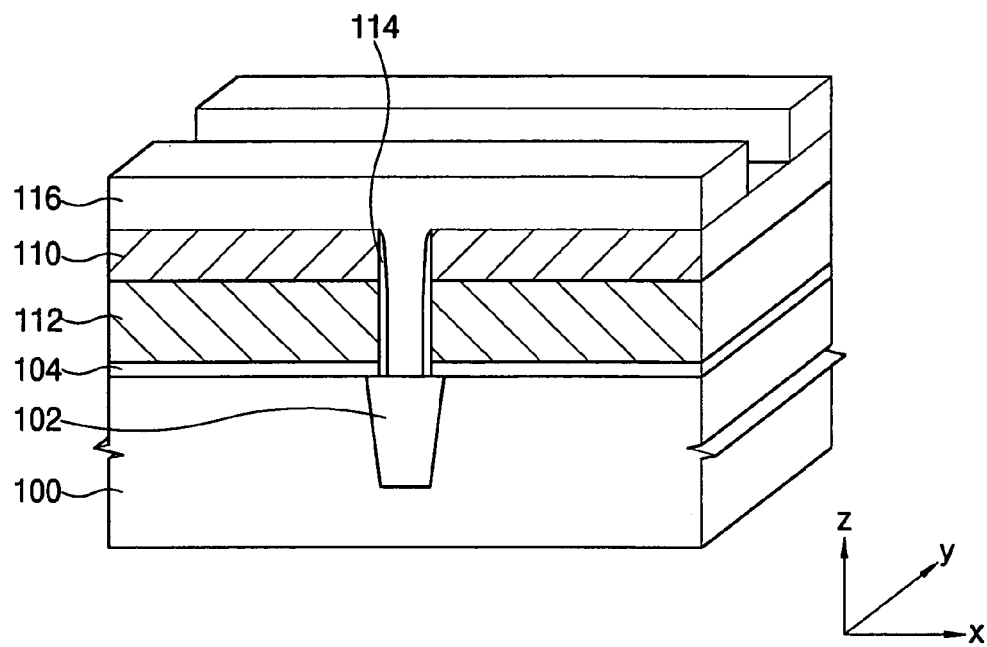

Referring to FIG. 5E, a photoresist layer is coated on the field region 102 and on the trim mask 110, and the photoresist layer is exposed and developed to form a photoresist pattern 116. The photoresist pattern 116 acts as an etching mask when the preliminary gate pattern is etched along a second direction that crosses the first direction, for example, at a right angle.

A developer is supplied to the substrate 100 for developing the exposed photoresist layer. The polysilicon of the preliminary gate pattern 112 generally reacts with the developer, and the etching characteristics of the polysilicon are changed. However, the spacer 114 prevents the side surface of the preliminary gate pattern 112 from being exposed, and as a result, the developer cannot permeate into the preliminary gate pattern 112 during the developing process. Therefore, the etching characteristics of the polysilicon are not changed during the developing process, which prevents over-etching to the active region while performing the etching process on the preliminary gate pattern 112, thereby minimizing operation failures caused by over-etching the active region.

Figure 5F:
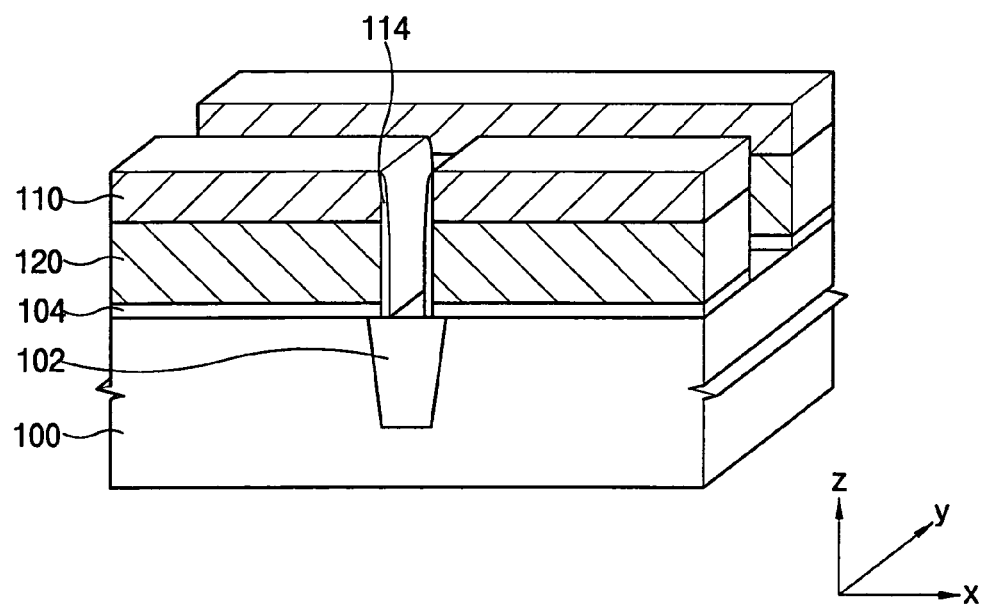

Referring to FIG. 5F, the trim mask 110 and the preliminary gate pattern 112 are sequentially etched away using the photoresist pattern 116 as an etching mask thereby forming a gate pattern 120 along the second direction that crosses the first direction at a right angle.

Accordingly, the gate pattern 120 is separated along the first and second directions so that the gate pattern is independently positioned like an island in a section defined by the first and second directions and overlaps with the active region 102 as shown in FIG. 4. The gate pattern 120 according to the illustrated embodiments is formed by a dual etching process. A first etching process is carried out using the trim mask 110 as an etching mask, and then a second etching process is carried out using the photoresist pattern 116 as an etching mask. Therefore, the corner portion 111 of the gate pattern 120 is formed at substantially a right angle, so that the processing margin for the gate pattern to overlap with the active region may be increased. That is, since the corner portion of the gate pattern 120 is substantially at a right angle, the overlapping area of the gate pattern with the active region does not decrease even if the gate pattern is incorrectly aligned on the active region. Therefore, the gate pattern need not be long enough to cross the active region when the peripheral portion of the gate pattern is rounded.

Embodiments of the invention may be practiced in many ways. What follows are exemplary, non-limiting descriptions of some embodiments of the invention.

According to some embodiments of the invention, in a semiconductor device that includes separated and independent gate patterns, every corner portion of the gate patterns are formed substantially at right angles, thus the processing margin for the gate pattern to overlap with the active region of the substrate is increased. The increased processing margin prevents a channel of the transistor from being narrowed, thus operational failures due to narrowing of the channel are minimized.

In addition, the etching characteristics of polysilicon are unchanged by a developer in forming a photoresist pattern that functions as an etching mask for patterning a polysilicon layer. Accordingly, over-etching of the polysilicon layer may be prevented when the polysilicon layer is patterned.

According to some embodiments of the invention, a method of manufacturing a semiconductor device includes defining an active region by forming a field region on a substrate. A gate oxide layer and a polysilicon layer are formed on the substrate, and a preliminary gate pattern is formed by partially removing the polysilicon layer along a first direction with a first etching process. A spacer is formed along a side surface of the preliminary gate pattern, and a separated gate pattern is formed by partially removing the preliminary gate pattern along a second direction crossing the first direction with a second etching process. The resulting gate patterns overlap the active regions and are separated from each other.

According to other embodiments of the invention, a method of manufacturing a semiconductor device includes defining an active region by forming a field region on a semiconductor substrate. A gate oxide layer and a polysilicon layer are formed on the semiconductor substrate. A trim mask is formed on the polysilicon layer to separate the polysilicon layer along a first direction, and a preliminary gate pattern is formed by etching the polysilicon layer using the trim mask as an etching mask. A spacer is formed along a side surface of the preliminary gate pattern. A photoresist pattern is formed on a hard mask layer such that a space between the preliminary gate patterns is filled with photoresist material. The preliminary gate pattern is separated along the second direction on a substrate by an etching process using the photoresist pattern as an etching mask. An exposed hard mask layer and an exposed polysilicon layer are etched away using the photoresist layer as an etching mask layer. The exposed hard mask layer and the exposed polysilicon layer are exposed between the photoresist patterns. As a result, separated gate patterns overlap with the active regions independently from each other.

The preceding embodiments are exemplary. Although the specification may refer to "an", "alternative", or "some" embodiment(s) in several locations, this does not necessarily mean that each such reference is to the same embodiment(s), or that the feature only applies to a single embodiment.

Although exemplary embodiments of the invention have been described above, it is understood that the invention should not be limited to only these described embodiments but that various changes and modifications may be made by one skilled in the art without departing from the spirit and scope of the invention as defined by the attached claims.

We claim:

1. A method of manufacturing a semiconductor device, comprising:
    defining an active region by forming a field region on a substrate;
    depositing a gate oxide layer and a polysilicon layer on the substrate;
    partially removing the polysilicon layer with a first etching process to form preliminary gate patterns along a first direction;
    depositing a spacer along side surfaces of the preliminary gate patterns; and partially removing the preliminary gate patterns with a second etching process to form gate patterns along a second direction crossing the first direction, the gate patterns overlaping the active region and separated from each other.

2. The method of claim 1, wherein depositing the spacer comprises:
depositing an insulation layer on the preliminary gate patterns and on the substrate between the preliminary gate patterns to a thickness in a range from about 10 Å to about 150 Å; and
anisotropically etching the insulation layer.

3. The method of claim 2, wherein depositing the insulation layer comprises coating a silicon oxide layer at a temperature no greater than about 200° C.

4. The method of claim 1, wherein partially removing the polysilicon layer along the first direction comprises:
disposing a trim mask on the polysilicon layer for separating the polysilicon layer; and
partially etching the polysilicon layer using the trim mask as an etching mask.

5. The method of claim 4, wherein disposing the trim mask comprises at least partially exposing the field region.

6. The method of claim 4, wherein disposing the trim mask on the polysilicon layer comprises depositing one selected from the group consisting of a silicon oxy-nitride (SiON) layer and a silicon nitride (SiN) layer.

7. The method of claim 1, wherein partially removing the preliminary gate patterns along the second direction comprises partially removing the preliminary gate patterns along a direction that is perpendicular to the first direction.

8. The method of claim 1, wherein partially removing the preliminary gate patterns with a second etching process comprises:
filling spaces between the preliminary gate patterns with a photoresist material and covering a hard mask layer with the photoresist material to form a photoresist pattern that exposes the hard mask layer and the polysilicon layer; and
etching the hard mask layer and the polysilicon layer to separate the preliminary gate patterns along the second direction by using the photoresist pattern as an etching mask.

9. The method of claim 1, wherein the first direction is parallel to a longitudinal direction of the active pattern.

10. The method of claim 1, wherein during the first and second etching processes a predetermined etching selectivity of the polysilicon layer is maintained with respect to a silicon oxide layer.

11. The method of claim 1, wherein a length of the gate is less than or equal to about 100 nm.

12. A method of manufacturing a semiconductor device comprising:
defining an active region by forming a field region on a semiconductor substrate;
depositing a gate oxide layer and a polysilicon layer on the semiconductor substrate;
forming a trim mask on the polysilicon layer for separating the polysilicon layer along a first direction;
separating the polysilicon layer along the first direction by etching the polysilicon layer using the trim mask as an etching mask to form preliminary gate patterns;
depositing a spacer along side surfaces of the preliminary gate patterns;
filling a space between the preliminary gate patterns with a photoresist material and covering a hard mask layer with the photoresist material to form a photoresist pattern that exposes the hard mask layer and the polysilicon layer; and
separating the preliminary gate patterns along a second direction by etching the hard mask layer and the polysilicon layer using the photoresist layer as an etching mask.

13. The method of claim 12, wherein depositing the spacer includes:
depositing an insulation layer on the preliminary gate pattern and on the substrate between the preliminary gate patterns to a thickness in a range from about 10 Å to about 150 Å; and
anisotropically etching the insulation layer.

14. The method of claim 13, wherein depositing the insulation layer comprises coating a silicon oxide layer at a temperature no greater than about 200° C.

15. The method of claim 12, wherein forming the trim mask comprises at least partially exposing the field region of the substrate.

16. The method of claim 12, wherein the first and second directions are perpendicular to each other.

17. The method of claim 12, wherein the first direction is perpendicular to a longitudinal direction of the active pattern.

18. The method of claim 12, further comprising maintaining a predetermined etching selectivity of the polysilicon layer with respect to a silicon oxide layer.

19. The method of claim 12, wherein forming the trim mask comprises forming a layer selected from the group consisting of a silicon oxy-nitride layer and a silicon nitride layer.

\* \* \* \* \*